US010665703B2

(12) United States Patent
Clark et al.

(10) Patent No.: US 10,665,703 B2
(45) Date of Patent: May 26, 2020

(54) SILICON CARBIDE TRANSISTOR

(71) Applicant: Raytheon Systems Limited, Glenrothes (GB)

(72) Inventors: David Trann Clark, Glenrothes (GB); Ewan Philip Ramsay, Dundee (GB)

(73) Assignee: Raytheon Systems Limited, Glenrothes (GB)

( * ) Notice: Subject to any disclaimer, the term of this patent is extended or adjusted under 35 U.S.C. 154(b) by 0 days.

(21) Appl. No.: 15/952,877

(22) Filed: Apr. 13, 2018

(65) Prior Publication Data

US 2018/0301548 A1    Oct. 18, 2018

(30) Foreign Application Priority Data

Apr. 13, 2017    (GB) .................... 1705986.6

(51) Int. Cl.
| | | |
|---|---|---|
| *H01L 29/735* | (2006.01) | |
| *H01L 29/16* | (2006.01) | |
| *H01L 21/265* | (2006.01) | |
| *H01L 29/66* | (2006.01) | |
| *H01L 29/10* | (2006.01) | |
| *H01L 21/04* | (2006.01) | |

(52) U.S. Cl.
CPC .......... *H01L 29/735* (2013.01); *H01L 21/046* (2013.01); *H01L 21/26513* (2013.01); *H01L 29/107* (2013.01); *H01L 29/1008* (2013.01); *H01L 29/1608* (2013.01); *H01L 29/66068* (2013.01); *H01L 29/6625* (2013.01)

(58) Field of Classification Search
None
See application file for complete search history.

(56) References Cited

U.S. PATENT DOCUMENTS

| | | |
|---|---|---|
| 3,504,181 A | 3/1970 | Chang et al. |
| 5,093,576 A | 3/1992 | Edmond et al. |
| 5,149,663 A | 9/1992 | Chai et al. |
| 5,953,600 A | 9/1999 | Gris |
| 5,969,378 A | 10/1999 | Singh |
| 6,703,647 B1 | 3/2004 | Garcia et al. |
| 9,318,585 B1 | 4/2016 | Cai et al. |

(Continued)

FOREIGN PATENT DOCUMENTS

| | | |
|---|---|---|
| CN | 107946355 A | 4/2018 |
| EP | 0 405 045 A1 | 1/1991 |

(Continued)

OTHER PUBLICATIONS

Great Britain Further Examination Report dated May 10, 2019 for Great Britain Application No. GB1705986.6; 5 Pages.

(Continued)

*Primary Examiner* — Lex H Malsawma
(74) *Attorney, Agent, or Firm* — Daly Crowley Mofford & Durkee, LLP

(57) ABSTRACT

The lateral bipolar junction transistor has a silicon carbide layer, the silicon carbide layer comprises a base region with a first conductivity type, a collector region with a second conductivity type and an emitter region with a second conductivity type. The collector region and the emitter region are within the base region, and the base region, collector region and emitter region are all arranged along an upper surface of the silicon carbide layer.

17 Claims, 6 Drawing Sheets

(56) References Cited

U.S. PATENT DOCUMENTS

| | | | |
|---|---|---|---|
| 9,368,537 | B1 | 6/2016 | Holmes et al. |
| 9,966,459 | B2 * | 5/2018 | Senapati .............. H01L 29/735 |
| 10,276,700 | B2 * | 4/2019 | Senapati .............. H01L 29/735 |
| 2003/0087466 | A1 | 5/2003 | Wang et al. |
| 2005/0067653 | A1 | 3/2005 | Litwin et al. |
| 2006/0261876 | A1 | 11/2006 | Agarwal et al. |
| 2007/0037357 | A1 | 2/2007 | Culp |
| 2007/0105301 | A1 | 5/2007 | Chen et al. |
| 2007/0254398 | A1 * | 11/2007 | Wakabayashi ...... H01L 21/8249 |
| | | | 438/59 |
| 2008/0283926 | A1 | 11/2008 | Sridhar |
| 2010/0059850 | A1 | 3/2010 | Harris |
| 2010/0213504 | A1 | 8/2010 | Ko et al. |
| 2010/0252860 | A1 | 10/2010 | Yang et al. |
| 2013/0187173 | A1 * | 7/2013 | Domeij .............. H01L 29/1004 |
| | | | 257/77 |
| 2013/0187256 | A1 | 7/2013 | Shirai |
| 2014/0028387 | A1 | 1/2014 | Saunders |
| 2014/0084301 | A1 | 3/2014 | Cai et al. |
| 2015/0349186 | A1 | 12/2015 | Hsu et al. |
| 2016/0071962 | A1 * | 3/2016 | Senapati .............. H01L 29/735 |
| | | | 257/48 |
| 2016/0133731 | A1 | 5/2016 | Song |
| 2016/0315211 | A1 | 10/2016 | Chandrashekhar et al. |

FOREIGN PATENT DOCUMENTS

| | | |
|---|---|---|
| EP | 0438167 A1 | 7/1991 |
| EP | 1 253 645 A2 | 10/2002 |
| EP | 0 894 339 B1 | 3/2004 |
| GB | 2538348 A | 11/2016 |
| GB | 2543420 A | 4/2017 |
| JP | S5619653 A | 2/1981 |
| WO | WO 97/39485 | 10/1997 |
| WO | WO 2007/128075 A2 | 11/2007 |
| WO | WO 2014/018156 A1 | 1/2014 |

OTHER PUBLICATIONS

U.S. Appl. No. 15/952,665, filed Apr. 13, 2018, Clark, et al.
Claims as Filed for International Application No. GB1705989.0; 6 Pages.
Combined Search and Examination Report under Section 17 and 18(3) dated Aug. 18, 2017 for International Application GB1705989.0; 9 Pages.
Combined Search and Examination Report under Section 17 and 18(3) dated Aug. 21, 2017 for International Application GB1705986.6; 9 Pages.
Combined Search and Examination Report under Section 17 and 18(3) dated Sep. 26, 2017 for International Application GB1705983.3; 9 Pages.
Response (with Claims) to Great Britain Examination Report dated Aug. 21, 2017 for Application No. 1705986.6; Response filed Jul. 26, 2018; 7 Pages.
Great Britain Further Examination Report dated Aug. 29, 2018 for Application No. 1705986.6; 6 Pages.
Van Zeghbroeck, "Chapter 5: Bipolar Junction Transistors;" from *Principles of Semiconductor Devices*; Jan. 2011; Available from: https://ecee.colorado.edu/~bart/book/book/chapter5/ch5_8.htm; 2 Pages.
Analog Devices Wiki, "Chapter 8: Transistors;" Apr. 29, 2014; Available from: https://wiki.analog.com/university/courses/electronics/text/chapter-8?rev=1398779534; 20 Pages.
Response (with Amended Claims) to Combined Search and Examination Report under Sections 17 and 18(3) dated Sep. 26, 2017 for Great Britain Application No. GB1705983.3; Response filed Apr. 15, 2019; 34 Pages.
Intention to Grant dated Aug. 22, 2019 for Great Britain Application No. GB1705983.3; 2 Pages.
U.S. Non-Final Office Action dated Feb. 14, 2020 for U.S. Appl. No. 15/952,665; 15 pages.

* cited by examiner

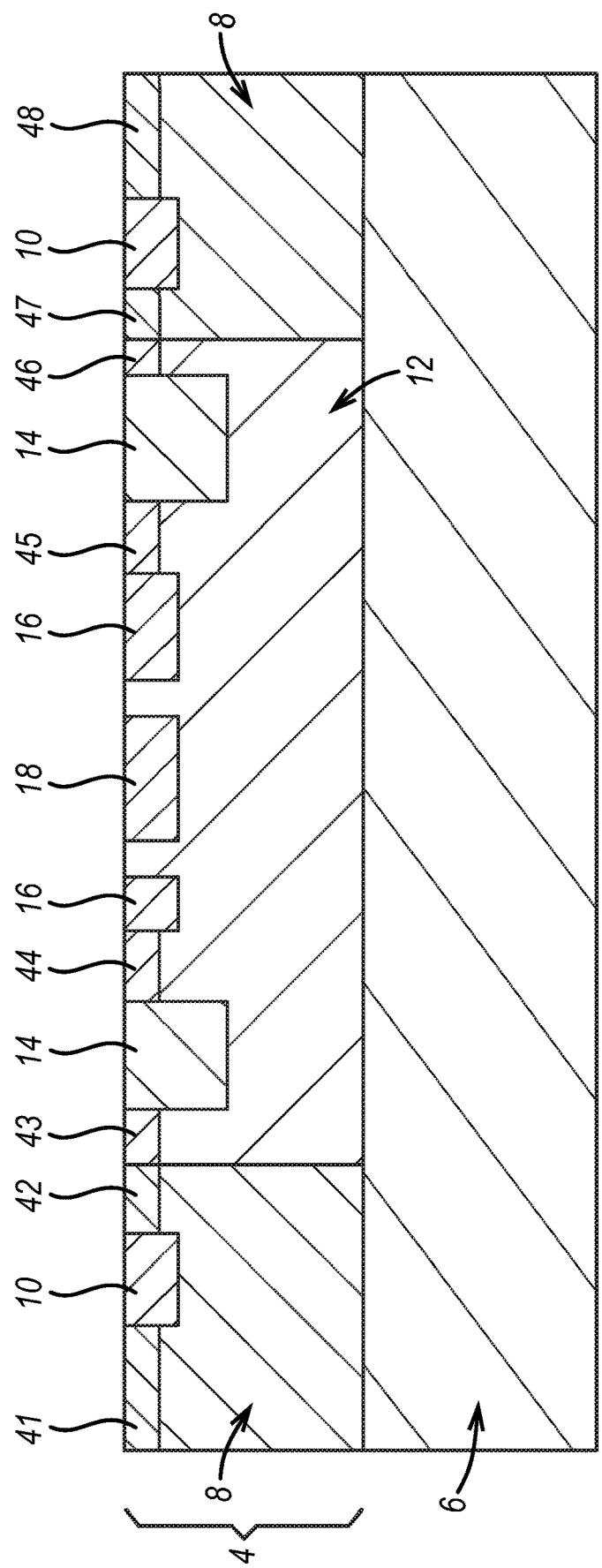

SILICON CARBIDE TRANSISTOR

CROSS REFERENCE TO RELATED APPLICATION

This application claims priority to UK Patent Application No. 1705986.6 filed on Apr. 13, 2017 in the UK Intellectual Property Office, the entire disclosure of which is incorporated herein by reference.

BACKGROUND

The present invention relates to a lateral bipolar junction transistor and a method of manufacturing the lateral bipolar junction transistor. The present invention also relates to a complementary device comprising the lateral bipolar junction transistor.

Silicon carbide (SIC) is a semiconductor with a range of useful properties such as large breakdown electrical field strength, large saturated electron drift velocity, small dielectric constant, reasonably high electron mobility and high thermal conductivity. It is therefore a candidate material for producing power devices for high temperature and/or high voltage applications. However, limited amount of work has been conducted investigating potential devices made from silicon carbide. The present invention relates to a surprisingly advantageous device.

SUMMARY

The present invention relates to a lateral bipolar junction transistor comprising: a silicon carbide layer; wherein the silicon carbide layer comprises a base region comprising a dopant of a first type so as to have a first conductivity type; a collector region comprising a dopant of a second type so as to have a second conductivity type, wherein the collector region is within the base region; and an emitter region comprising a dopant of a second type so as to have a second conductivity type, wherein the emitter region is within the base region; and wherein the base region, collector region and emitter region are all arranged along a surface of the silicon carbide layer.

The inventors have discovered that such a device has a surprisingly good performance. In particular, arranging the regions along a single surface results in a transistor with a lateral layout and an unexpectedly high gain.

The lateral bipolar junction transistor has a lateral layout. That is, the various regions of the transistor are arranged along a surface of the silicon carbide layer. This surface may be planar. For the lateral bipolar junction transistor these regions are the base region, the collector region, and the emitter region. The lateral layout increases the ease of manufacture. It enables the various regions to be connected to an external circuit in a straightforward manner. The connections to each of the base region, the collector region and the emitter region may be present on the surface of the silicon carbide layer along which the regions are arranged.

The various regions of the transistor are arranged along the same surface of the silicon carbide layer. This surface may be referred to herein as the "upper surface". The use of the term "upper surface" does not limit the orientation of the device but is simply used as a label for one of the surfaces of the silicon carbide layer.

The various regions (base, collector and emitter) refer to the regions that perform the function of the base, collector and emitter of the transistor. The lateral bipolar junction transistor of the present invention can therefore be connected to an external circuit in accordance with the function of these regions.

As noted above, the lateral bipolar junction transistor is formed in a silicon carbide layer. The form of the silicon carbide in the silicon carbide layer is not particularly limited provided that it is a single crystal form. For example, the crystalline structure of the silicon carbide can be 3C, 4H, or 6H. The crystalline form 4H is particularly useful due to the high quality nature of the wafers that are commercially available.

The surface orientation of the surface of the silicon carbide layer can be chosen as required by the application. For example, the 4H silicon carbide substrate is commercially available with an on-axis surface orientation relating to the {0001} planes, as well as oriented 4 degrees off this axis towards the <1120> directions or 8 degrees towards these directions. It has been found that the 4 degree off-axis orientation was particularly effective.

As noted above, the various regions of the silicon carbide layer can have a first conductivity type or a second conductivity type. When referring to conductivity types, this refers to the semiconductor either having an n-type conductivity (i.e. electrons are the majority carriers) or a p-type conductivity (i.e. holes are the majority carriers). Therefore, when it is stated that there is a first conductivity type, this can be either the n-type or p-type conductivity type. When it is stated that there is a second conductivity type, this second conductivity type is necessarily different from the first conductivity type. For example, if the first conductivity type is n-type conductivity, then the second conductivity type is necessarily p-type conductivity and vice versa.

In order for the silicon carbide to have an n-type conductivity, it must contain an n-type dopant. Examples of n-type dopant in silicon carbide include nitrogen and phosphorous. In a similar manner, in order for the silicon carbide to have a p-type conductivity, it must contain a p-type dopant. Examples of p-type dopants include boron and aluminium. Accordingly, as detailed above, when a region comprises a dopant of a first type, this dopant can be present such that the region has a first conductivity type. Conversely, when a region has a dopant of a second type, this dopant can be present such that the region has a second conductivity type.

The dopant of a first type can be an n-type dopant and then the first conductivity type can be n-type conductivity. In a similar manner, the dopant of a second type can be a p-type dopant and the second conductivity type can be p-type conductivity. Alternatively, the dopant of the first type can be a p-type dopant and the first conductivity type a p-type conductivity, while the dopant of a second type can be an n-type dopant and the second conductivity type can be n-type conductivity.

In the present invention, various regions of the transistor or the complementary device comprise dopants of the second type. The dopants of the second type in the various regions can be the same dopant of the second type. Alternatively, the dopants of the second type in the various regions can be different dopants of the second type. Further, some regions comprising dopants of the second type can have the same dopant of the second type, which may be a different dopant of the second type relative to other regions comprising dopants of the second type. The same is true mutatis mutandis for the various regions of the complementary device that comprise dopants of the first type. Herein, the dopants of the various regions may be given a label, such as a second dopant of the second type and a third dopant of the second type. Such labels do not exclude the possibility that these dopants may be the same dopant. Conversely, these dopants may be different dopants.

The dopant of the first type is present in a sufficient concentration so as to confer a first conductivity type on the region, for example the base region. In a similar manner, the dopant of a second type is present in a sufficient concentration so as to give a second conductivity type to particular regions, for example the collector and emitter regions.

The collector region and the emitter region are both within the base region. This means the collector region and the emitter region are each surrounded by the base region, apart from at the surface of the silicon carbide layer along which they are arranged. The collector region and emitter region are separated by at least part of the base region in order to form the lateral bipolar junction transistor arrangement.

The lateral bipolar junction transistor of the present invention may further comprise a dielectric layer on the surface of the silicon carbide layer overlapping the base region between the collector region and the emitter region. A dielectric layer is a layer of dielectric material.

The dielectric material can be any suitable dielectric material such as silicon dioxide, silicon nitride, silicon oxynitride, aluminium oxide, aluminium oxynitride and hafnium oxide. It is particularly preferred that the dielectric layer is silicon dioxide. As noted above, the dielectric layer overlaps the base region between the collector region and the emitter region. In other words, the dielectric layer is formed on the base region between the collector region and the emitter region, it is preferable that the dielectric layer directly contacts the base region between the collector region and the emitter region. It is preferable that the dielectric layer is formed by a step comprising passivating the silicon carbide layer.

Not wishing to be bound by theory, it is believed that the dielectric layer formed on the surface of the silicon carbide layer on the base region contributes to the formation of surface states in the silicon carbide layer. It is believed that these surface states contribute to the particularly high gain exhibited by the lateral bipolar junction transistor of the present invention.

The dielectric layer may also overlap the junction between the base region and the collector region and the junction between the base region and the emitter region. In other words, the dielectric layer may be formed on the base region such that it is also formed on the junctions between the base region and the collector region and the base region and the emitter region. It is believed that this overlap of the junctions additionally contributes to the creation of surface states that allow a particularly high gain in the transistor of the present invention.

As noted above, the collector region and the emitter region both contain dopant of the second type. The dopant of the second type can be the same dopant for the collector region and the emitter region. This has been shown to be an effective way of producing a high performance device and also increases the ease of manufacture, since the doping process can be carried out simultaneously for both regions.

The collector region and the emitter region may contain equivalent concentrations of the dopant of a second type. This is an effective way of producing a high quality device with an increased ease of manufacture, since the collector and emitter regions can be doped simultaneously.

When referring to the various regions of the device, the regions can be discerned by having distinct properties. For example, the base region is the region that has a first conductivity type and the collector region and emitter region are two distinct regions within the base region that have a second conductivity type. The different regions can therefore be discerned by their different conductivity types.

When referring to the concentration of dopant within regions there can be variation in concentration in the region. However, substantially all of the region will have doping concentration in a particular range. Further, all of the region may have a doping concentration in a particular range.

When referring to the collector region and the emitter region containing equivalent concentrations of dopant, this refers to the concentration of dopant in one region being substantially the same as the concentration of dopant in the other region. In particular, the doping profile concentration in a collector region may be equivalent to the doping profile in the emitter region along a particular direction. Again, such equivalence allows the regions to be processed simultaneously. In this regard, it is particularly preferred that the doping profiles are equivalent in a direction perpendicular to the surface of the silicon carbide layer along which the regions are arranged. This allows simultaneous implantation of the collector region and the emitter region.

The collector region may have a concentration of a dopant of a second type in the range of $1 \times 10^{19}$ cm$^{-3}$ to $1 \times 10^{21}$ cm$^{-3}$. In particular, the collector region may have a concentration of a dopant of the second type in the range of $5 \times 10^{19}$ cm$^{-3}$ to $5 \times 10^{20}$ cm$^{-3}$. In particular, the collector region may have a concentration of a dopant of the second type of about $1 \times 10^{20}$ cm$^{-3}$. The emitter region may have a concentration that is selected from the ranges given in relation to the collector region.

The base region may have a concentration of the dopant of the first type of less than $1 \times 10^{13}$ cm$^{-3}$. In particular, the base region may have a concentration of the dopant of the first type of less than $5 \times 10^{17}$ cm$^{-3}$. In particular the base region may have a concentration of the dopant of the first type of less than $1 \times 10^{17}$ cm$^{-3}$. In particular the base region may have a concentration of the dopant of the first type of about $1 \times 10^{17}$ cm$^{-3}$. The concentration of dopant of the first type in the base region may be more than $1 \times 10^{14}$ cm$^{-3}$, or more than $1 \times 10^{16}$ cm$^{-3}$, or more than $1 \times 10^{16}$ cm$^{-3}$.

Without wishing to be bound by theory, it is believed that a low base region concentration is particularly effective with the presence of a dielectric layer present on the base region. In particular, it is believed that the low dopant concentration makes the base region particularly susceptible to the formation of a conducting surface channel region that contributes to the remarkably high gain demonstrated by the device of the present invention.

The concentration of the dopant of the first type at the surface of the base region (that is the surface along which the collector, emitter and base regions are arranged) may be less than that in the bulk of the base region. The base region may have a concentration of the dopant of the first type of less than $1 \times 10^{17}$ cm$^{-3}$ at the surface of the silicon carbide layer between the collector region and the emitter region. In particular, the concentration of the dopant of the first type at the surface of the base region between the collector region and the emitter region may be less than $5 \times 10^{16}$ cm$^{-3}$, or less than $1 \times 10^{16}$ cm$^{-3}$. The low concentration of the dopant at the surface is considered to contribute to the creation of a surface channel that contributes to the exceptionally high gain of the device of the present invention.

The concentration of dopants can be controlled to minimise the influence of potential parasitic transistors while maintaining high gain of the desired lateral transistor. The parasitic transistors can be oriented vertically, that is along the direction that runs perpendicular to the surface of the silicon carbide layer along which the base region, collector region and emitter region are arranged. These vertical parasitic transistors can be of the form of bipolar junction transistors with a collector, base and emitter. Parasitic transistors can be oriented laterally, that is along a direction that runs parallel to the surface of the silicon carbide layer along which the base region, collector region and emitter region are arranged. These lateral parasitic transistors can be of the form of bipolar junction transistors with a collector, base and emitter. The lateral parasitic transistors can be of the form of field effect transistors (such as MOSFETs) where components such as interconnect layers above the silicon carbide layer surface perform the function of a gate electrode and thick $SiO_2$ between the silicon carbide surface and the interconnect layer performs the function of a gate oxide. The influence of any of these forms of parasitic transistor can be reduced by relatively increasing the presence of dopant between the junctions of the potential parasitic transistors.

The concentration of dopant between the junctions of the transistor is the concentration in the region that separates the collector and emitter of the transistor. In other words, for an npn type junction it is the concentration of the p-type dopant in the p-type region between the two n-type regions.

Lateral parasitic transistors can occur between adjacent regions. For example, a parasitic lateral transistor can exist between the collector/emitter regions of a second conductivity type in the base region, the body of the base region and the body of any adjacent region of a second conductivity type. Equivalent lateral parasitic transistors can exist anywhere where there is a series of alternating volumes of different conductivity types.

In order to reduce the influence of lateral parasitic transistors the dopant concentration can be increased within the base region in the direction of the interface with a laterally adjacent region. This region of increased concentration is outside the active area of the lateral bipolar junction transistor, the active area being the area encompassing the collector region, the emitter region, and the base region between the collector region and the emitter region. This concentration increase reduces the gain and maximises punchthrough or threshold voltage associated with lateral parasitic transistors that may exist between the adjacent regions.

In order to suppress lateral and vertical parasitic transistors, parasitic transistor suppression regions can be formed. For example, parasitic transistor suppression regions comprising a dopant of a first type can be formed in the base region. The concentration of dopant of the first type in the parasitic transistor suppression regions in the base region, outside of the active area, can be in the range of $1\times10^{17}$ cm$^{-3}$ to $1\times10^{20}$ cm$^{-3}$. In particular, the concentration may be in the range of $1\times10^{18}$ cm$^{-3}$ to $1\times10^{19}$ cm$^{-3}$. These ranges of concentration are equally applicable to the concentration of dopant of the first type or second type in other regions of the device where parasitic transistor suppression is required.

Parasitic transistor suppression regions may be formed along the surface of the base region in all areas that are not the active area or used for other functions. This minimises the influence of these parasitic transistors.

The base region may comprise a base contact region. The base contact region is a region that has a higher concentration of dopant of the first type relative to the rest of the base region. Such a base contact region facilitates the connection to the base region. The base contact region may be arranged along the surface of the silicon carbide layer along with the base region, collector region and emitter region. The base contact region is preferably positioned so as not to be in the active area of the lateral bipolar junction transistor between the collector region and the emitter region. However, the base contact region may be positioned in the active area. The base contact region is particularly relevant when the base is stimulated via electrical signals from an external circuit. However, the base region of the lateral bipolar junction transistor of the present invention may also be stimulated by other means. The high gain of the lateral bipolar junction transistor of the present invention will provide enhanced sensitivity to the chosen stimulus.

The base contact region may have a concentration of a dopant of a first type in the range of $1\times10^{19}$ cm$^{-3}$ to $1\times10^{21}$ cm$^{-3}$. In particular, the base contact region may have a concentration of a dopant of the first type in the range of $5\times10^{19}$ cm$^{-3}$ to $5\times10^{20}$ cm$^{-3}$. In particular, the base contact region may have a concentration of a dopant of the first type of about $1\times10^{20}$ cm$^{-3}$.

In the present invention, the first conductivity type may be p-type conductivity and the second conductivity type may be n-type conductivity. In this way, the lateral bipolar junction transistor is an npn junction type transistor. In other words, n-type regions are the collector and the emitter and the p-type region is the base. Alternatively, the first conductivity type may be an n-type conductivity type and the second conductivity type may be a p-type conductivity type. In this way, the lateral bipolar junction transistor is a pnp junction type transistor.

The silicon carbide layer may be on a silicon carbide substrate. The silicon carbide substrate may comprise a dopant of a second type so as to have a second conductivity type. This is therefore distinct from the base region, which has a first conductivity type. In this manner, the silicon carbide substrate may be used to define the base region.

The silicon carbide layer may be a silicon carbide epitaxial layer that is formed on the silicon carbide substrate. This epitaxial layer can comprise a dopant of a first type so as to have a first conductivity type and the base region is formed within this epitaxial layer. Producing an epitaxial layer with a first conductivity type increases the ease of manufacture of the transistor since the epitaxial layer is already of the correct conductivity type for forming the base region. Accordingly, only an emitter and collector region need to be further incorporated into the epitaxial layer in order to form a complete lateral bipolar junction transistor. In order to form a connection to the base, a base contact region can also be incorporated. This minimises the amount of subsequent processing that is required in order to produce the device. The reduction in processing in turn has the additional benefit of minimising damage to the silicon carbide layer, in particular the base region. This ensures a high performing device.

The silicon carbide epitaxial layer can be divided into distinct regions by the use of boundary regions. For example, a first boundary region may be present, wherein the first boundary region comprises a dopant of a second type so as to have a second conductivity type and the first boundary region extends the depth of the epitaxial layer to the substrate. In this way, the first boundary region spans the full depth of the epitaxial layer.

The epitaxial layer may further have a second boundary region, wherein the second boundary region comprises a dopant of a second type so as to have a second conductivity type and the second boundary region extends the depth of the epitaxial layer to the substrate. The epitaxial layer may have three or more such boundary regions. The presence of multiple boundary regions can divide the epitaxial layer into multiple isolated regions.

The presence of a first boundary region and/or a second boundary region of a second conductivity type can be used to define a region of a first conductivity type within the epitaxial layer. The defined region will be bordered by the first boundary region, and optionally the second boundary region, and the substrate, all of which are of the second conductivity type. In this way, it is possible to define the base region of the lateral bipolar junction transistor by the presence of the first boundary region, and/or second boundary region, and the substrate. This provides a particularly straightforward arrangement that isolates the base region from the rest of the epitaxial layer and minimises the amount of processing that is required within the base region in order to form the lateral bipolar junction transistor. This minimisation of further processing is advantageous from a manufacturing point of view and also minimises the amount of defects that are present in the lateral bipolar junction transistor and so ensures a high performance for the resulting device.

It is possible to electrically isolate the lateral bipolar junction transistor by providing an electrical contact to the first boundary region and/or second boundary region. Since the first boundary region and/or second boundary region extend to the substrate, the electrical contact can be used to bias the boundary region(s) and the substrate so as to isolate the boundary region(s) and the substrate from the base of the bipolar junction transistor. This isolation is effective against possible parasitic transistors as well as any other transistors that may be present in the silicon carbide layer. The electrical contact to the first boundary region and/or second boundary region can be via a substrate contact region in the first boundary region and/or second boundary region. Much like the base contact region, this is a region of increased dopant concentration. In this instance, it is an increased concentration of dopant of the second type that facilitates the connection to the boundary region and, therefore, to the substrate.

The substrate contact region may have a concentration of a dopant of a second type in the range of $1\times10^{19}$ cm$^{-3}$ to $1\times10^{21}$ cm$^{-3}$. In particular, the substrate contact region may have a concentration of a dopant of the second type in the range of $5\times10^{19}$ cm$^{-3}$ to $5\times10^{20}$ cm$^{-3}$. In particular, the substrate contact region may have a concentration of a dopant of the second type of about $1\times10^{20}$ cm$^{3}$.

The suppression of lateral parasitic transistors described herein will be particularly relevant when first and/or second boundary regions are present. Lateral parasitic transistors may exist between the alternating conductivity types of the collector/emitter regions, the base region and the boundary region(s). These lateral parasitic transistors can be suppressed as described above.

The suppression of vertical parasitic transistors is particularly relevant when a substrate of a second conductivity type is present. The regions of the transistor of a second conductivity type (such as collector and emitter regions) that are formed in the base region of a first conductivity type creates a potential parasitic vertical transistor composed of the second conductivity type region in the component, the first conductivity type region in the body of the base region and the second conductivity type region of the substrate along a vertical direction from the component to the substrate.

In order to reduce the influence of this parasitic vertical transistor, the concentration of the dopant of the first type in the base region can be varied.

The dopant of the first type can be increased within the base region towards the interface with the substrate. This increase is relative to the concentration of dopant between the junctions of the lateral bipolar junction transistor and may be in the ranges stated above. This allows a high gain to be maintained in the desired lateral transistor while reducing the gain and suppressing punchthrough associated with the vertical parasitic transistor. In particular, parasitic transistor suppression regions can be formed along the interface of the base region with the substrate.

The lateral bipolar junction transistor of the present invention may further comprise an interconnect layer that provides connections to the base region, the collector region and the emitter region. This will allow connection to external circuits and other devices that may be present on or within the silicon carbide layer. The interconnect layer is formed from electrical conduction regions and dielectric regions. The electrical conduction regions provide a path for electrical signals to the present devices, while the dielectric regions isolate the various electrical conduction regions from each other. The interconnect layer is present on the upper surface of the silicon carbide layer. The interconnect layer being positioned on the upper surface of the silicon carbide layer means that the interconnect layer may be in direct contact with the upper surface of the silicon carbide layer. Alternatively, other layers may be present between the interconnect layer and the upper surface of the silicon carbide layer. In any case, the interconnect layer is in electrical connection with the silicon carbide layer at areas where electrical connection is required. A silicide layer may be present between the interconnect layer and the silicon carbide layer.

The lateral bipolar junction transistor described herein can be part of a complementary device comprising a plurality of transistors. Additional transistors may be present in the boundary regions described herein. A transistor may be present in a well region. This well region may extend from the surface of the silicon carbide layer into the silicon carbide layer. However, the well region does not extend the full depth of this silicon carbide layer. The well region has a different conductivity type to the surrounding silicon carbide layer so as to form an isolated region. In particular, the well region may have a second conductivity type and be isolated by being surrounded by silicon carbide layer of the first conductivity type. In this manner, a well region can be present in the base region.

A well region present in the base region will have a second conductivity type. A further lateral bipolar junction transistor may be present in the well region. The further lateral bipolar junction transistor can have a collector region and emitter region of a first conductivity type arranged along the surface of the silicon carbide layer (preferably the same surface along which the collector region and emitter region of the lateral bipolar junction transistor are arranged). The further lateral bipolar junction transistor is thus a different junction type to the lateral bipolar junction transistor, thus providing a complementary device. The further lateral bipolar junction transistor can have analogous features to those described for the lateral bipolar junction transistor.

The present invention further relates to a method of manufacturing a lateral bipolar junction transistor, wherein the method comprises the following steps: obtaining a silicon carbide layer comprising a base region, the base region comprising a dopant of a first type so as to have a first conductivity type; implanting a dopant of a second type to form a collector region of a second conductivity type in the base region; implanting a dopant of a second type to form an emitter region of a second conductivity type in the base region; and wherein the base region, collector region and emitter region are all arranged along a surface of the silicon carbide layer.

This method allows production of the lateral bipolar junction transistor that has the surprisingly high gain described herein.

When implanting a dopant of a second type in the base region so as to form the collector and emitter regions that are of a second conductivity type, the dopant of the second type must be implanted to a sufficient concentration to counter-dope the first conductivity type base region. In other words, a sufficient amount of dopant of the second type must be implanted to the collector and emitter regions so as to ensure that they are changed from being of a first conductivity type to being of a second conductivity type. By implanting a dopant of second type to form the collector region and the emitter region, the areas of potential damage are limited to the collector region and the emitter region and a device of particularly high performance can be produced.

As noted herein, the dopant of a first type can be a p-type dopant. A preferred p-type dopant is aluminium.

As noted herein, the dopant of a second type can be an n-type dopant. Preferred n-type dopants are nitrogen and phosphorus.

Nitrogen is a particularly preferred n-type dopant for implanting deep regions, such as the boundary regions, base region or well regions described herein. The use of nitrogen as the implanted dopant helps to minimise the damage that is introduced and energy required to implant an n-type dopant into a significant depth of the silicon carbide layer due to its low mass.

Phosphorus is a particularly preferred n-type dopant for implanting shallower regions, such as the collector regions, emitter regions, base contact regions and substrate contact regions, when these are required to have n-type conductivity. The relatively higher mass of phosphorus helps to keep these regions shallow within the silicon carbide layer.

The implantation of the dopant of a second type to form the collector region and the emitter region results in the collector region and the emitter region extending from the surface of the silicon carbide layer into the silicon carbide layer. In this manner, the base region, collector region and the emitter region are all arranged along the surface of the silicon carbide layer. This lateral layout is particularly advantageous. As noted herein, the advantageous high gain of the device may be caused by surface effects that are possible due to the arrangement of the base region, collector region and emitter region along the surface of the silicon carbide layer.

As noted herein, the silicon carbide layer may be formed on a silicon carbide substrate. Further, the silicon carbide layer may be an epitaxial layer formed on a substrate. The epitaxial layer may comprise a dopant of first type so as to have a first conductivity type. The substrate may comprise a dopant of a second type so as to have a second conductivity type.

The silicon carbide layer may be grown on a substrate in such a manner so as to contain the dopant of a first type. This can result in the epitaxial layer having a first conductivity type. By introducing the dopant of a first type during the epitaxial growth of the silicon carbide layer it is possible to produce a high quality doped layer that avoids the potential defects that may be introduced by a subsequent implantation step. Nevertheless, it is possible to produce the device by obtaining a silicon carbide layer and then implanting a dopant of a first type in the silicon carbide layer so as to form the base region of a first conductivity type.

The first boundary region and second boundary region described above may be formed by implanting a dopant of a second type into the silicon carbide layer. This allows the isolation of the device by implanting second conductivity type regions around the base region of the lateral bipolar junction transistor. This approach for isolating the lateral bipolar junction transistor minimises the processing of the base region and so minimises the potential introduction of defects into this region of the device.

Further devices can be formed in the silicon carbide layer alongside the lateral bipolar junction transistor of the present invention. Such additional devices are not particularly limited but may be further transistors. These transistors could be field effect transistors (such as a MOSFET) or further bipolar junction transistors. When a transistor is described as a field effect transistor, it necessarily has a gate electrode for controlling its operations. When a transistor is described as a bipolar junction transistor, it does not have such a gate electrode that controls its operation.

Any further devices will need to be isolated from the lateral bipolar junction transistor. This can be achieved by forming the additional devices in the first boundary region and/or second boundary region (or further boundary regions) described herein. As described herein, these boundary regions are of a second conductivity type. It is therefore particularly straightforward to produce a transistor in the first and/or second boundary region and/or further boundary region that has a source and a drain, or a collector and emitter, that are of a first conductivity type. This is simply achieved by implanting a dopant of a first type in the first and/or second boundary regions to form the required source and drain, or collector and emitter, in a similar manner described for the bipolar junction transistor of the present invention. It should be noted that if a bipolar junction transistor is formed in the boundary region and the body of the boundary region is used as the base, then the base will be connected to the substrate. This will have to be taken into consideration when designing a device with multiple transistors. Accordingly, forming field effect transistors in the boundary region(s) is a particularly effective approach to avoid this concern. Alternatively or in addition, well regions can be utilised in the boundary regions so as to isolate transistors from the substrate, as described herein.

A further transistor can be formed in regions of a first conductivity type that are isolated from the base region of the lateral bipolar junction transistor by the presence of the boundary region(s). Transistors in these regions can be formed in an analogous manner to the lateral bipolar junction transistor described herein and may be field effect transistors.

It is further possible to create isolated regions in the silicon carbide layer by utilising well structures. Therefore, a dopant of a second type may be implanted in the silicon carbide layer so as to form a well region of a second conductivity type within the first conductivity type silicon carbide layer. This well region may extend from the surface of the silicon carbide layer into the silicon carbide layer. However, the well region does not extend the full depth of this silicon carbide layer. This is a well structure and ensures that the well region is isolated by being surrounded by silicon carbide layer of the first conductivity type and not being in contact with the opposite surface of the silicon carbide layer.

Further components can then be formed in this isolated well region. For example, a transistor can be formed in this well region and may be connected with the lateral bipolar junction transistor via an interconnect layer. A silicide layer may be present between the surface of the silicon carbide layer and the interconnect layer.

Features that are described herein in relation to the device of the lateral bipolar junction transistor are equally applicable to the method of manufacturing that device. Further, any features described in relation to the method of manufacturing the device are also applicable to the device itself.

The present invention will now be described with reference to the following drawings.

BRIEF DESCRIPTION OF THE DRAWINGS

FIG. 1b is a cross-sectional view of the npn lateral bipolar junction transistor of FIG. 1a.

FIG. 2b is a cross-sectional view of the pnp lateral bipolar junction transistor of FIG. 2a.

FIG. 3 is a Gummel plot illustrating the performance of the npn lateral bipolar junction transistor of FIG. 1a.

FIG. 4 is a Gummel plot illustrating the performance of the pnp lateral bipolar junction transistor of FIG. 2a.

DETAILED DESCRIPTION

Figure 1A:
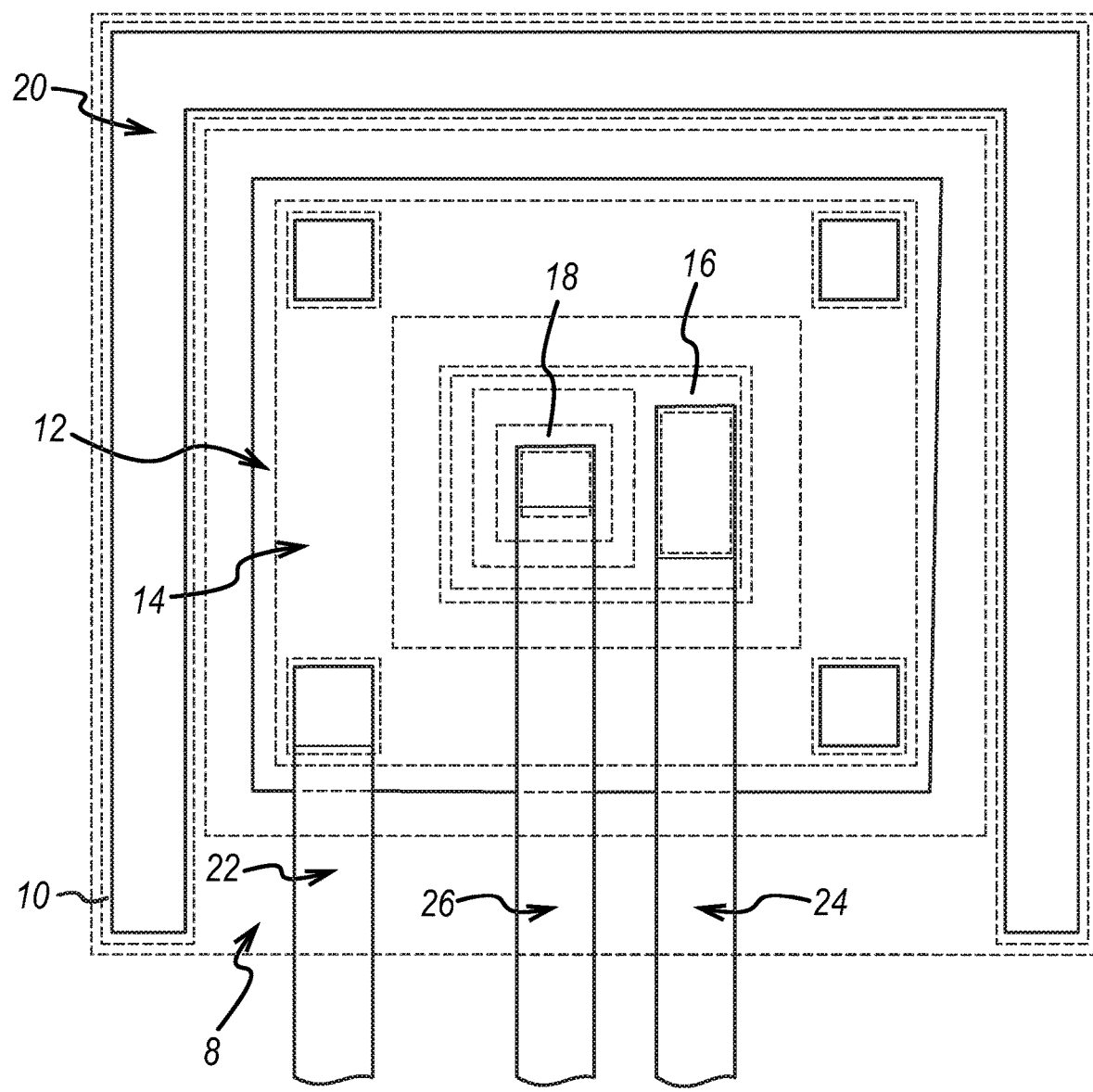
FIG. 1a is a plan view of an npn lateral bipolar junction transistor according to the present invention.

FIG. 1a and FIG. 1b depict a lateral bipolar junction transistor according to the present invention. This lateral bipolar junction transistor is an npn transistor.

The lateral bipolar junction transistor is formed in epitaxial layer 4 that is on top of substrate 6. Both the epitaxial layer 4 and the substrate 6 are silicon carbide material. The substrate 6 is doped with nitrogen to a level of $5\times10^1$ cm$^{-3}$ so as to have n-type conductivity.

The epitaxial layer 4 is divided into different regions. There is a first boundary region 8 that extends the depth of the epitaxial layer 4 and has n-type conductivity due to the presence of nitrogen as an n-type dopant at a level of $4\times10^{17}$ cm$^{-3}$. This boundary region 8 is in the form of a square frame when viewed in the plan view.

The first boundary region 8 and the substrate 6 combine to form a continuous n-type conductivity region. This continuous region surrounds a p-type conductivity region 12, in which the various regions of the lateral bipolar junction transistor are formed. The lateral bipolar junction transistor utilises this p-type conductivity region as the base region of the transistor. This base region 12 has aluminium as a p-type dopant at a level of $1\times10^{17}$ cm$^{-3}$. There is formed a highly doped p-type conductivity region 14 that is part of the connection of this base region 12 to an external circuit and has aluminium as a p-type dopant at a doping level $1\times10^{20}$ cm$^{-3}$. The use of a highly doped region in this manner reduces resistance at the contact.

Within the base region 12 the transistor's collector region 16 and emitter region 18 are formed. The collector region 16 and emitter region 18 are highly doped n-type conductivity regions having phosphorus as an n-type dopant at a level of $5\times10^{19}$ cm$^{-3}$. The collector region 16 and the emitter region 18 are therefore n-type conductivity regions separated by the p-type conductivity region of the base 12. This is the npn transistor. The collector region 16, base region 12 and emitter region 18 are all arranged along the surface of the silicon carbide epitaxial layer 4. This surface of the silicon carbide layer is the upper surface and it is a planar surface.

As depicted in FIG. 1a the collector region 16 is constructed to surround the emitter region 18. This particular layout enhances the performance of the lateral bipolar junction transistor. The heavily doped p-type region 14 for connecting the base to the external circuit is also formed to surround the emitter region 18 and the collector region 16. This helps minimise the resistance associated with making this connection.

The first boundary region 8 has a highly doped region 10. This highly doped region 10 has phosphorus as an n-type dopant at a level of $5\times10^{19}$ cm$^{-3}$ so as to have an n-type conductivity. This provides a low resistance connection to the bulk of the boundary region and thus to the substrate. The highly doped region 10 can therefore be used as a substrate contact. This can be utilised to bias the boundary regions and the substrate so as to ensure isolation for the lateral bipolar junction transistor regions within the base region 12.

The active area of the transistor is the area containing the collector region 16, emitter region 18 and the base region that is between the collector region 16 and the emitter region 18. This active area of the base region is free of further doping. All other areas 41, 42, 43, 44, 45, 46, 47, 48 arranged along the surface of the silicon carbide layer contain additional doping in order to minimise the presence of parasitic lateral bipolar junction or field effect transistors.

The upper surface along which the collector, base and emitter regions are arranged is passivated with a silicon dioxide layer (not shown).

Interconnects are provided for connecting to the various regions (not shown in FIG. 1b). Substrate interconnect 20, base interconnect 22, collector interconnect 24, and emitter interconnect 26 are all formed on top of the passivated epitaxial layer 4 at a higher level of the device.

In relation to FIG. 1a, the emitter 18 has a square area with a side length of 5 μm, and the gap between the collector region 16 and emitter region 18 is 1.2 μm. Although this embodiment depicts a single emitter having a square plan area, it is possible to utilise an arrangement of multiple emitters with the present invention. These emitters can be connected in parallel. It is also possible for the emitter to have a different plan area shape, such as hexagonal, rectangular, circular, a shape with a plurality of fingers etc. Overall the exact geometrical form of the emitter and the other components is not particularly limited in the present invention.

Figure 2A:
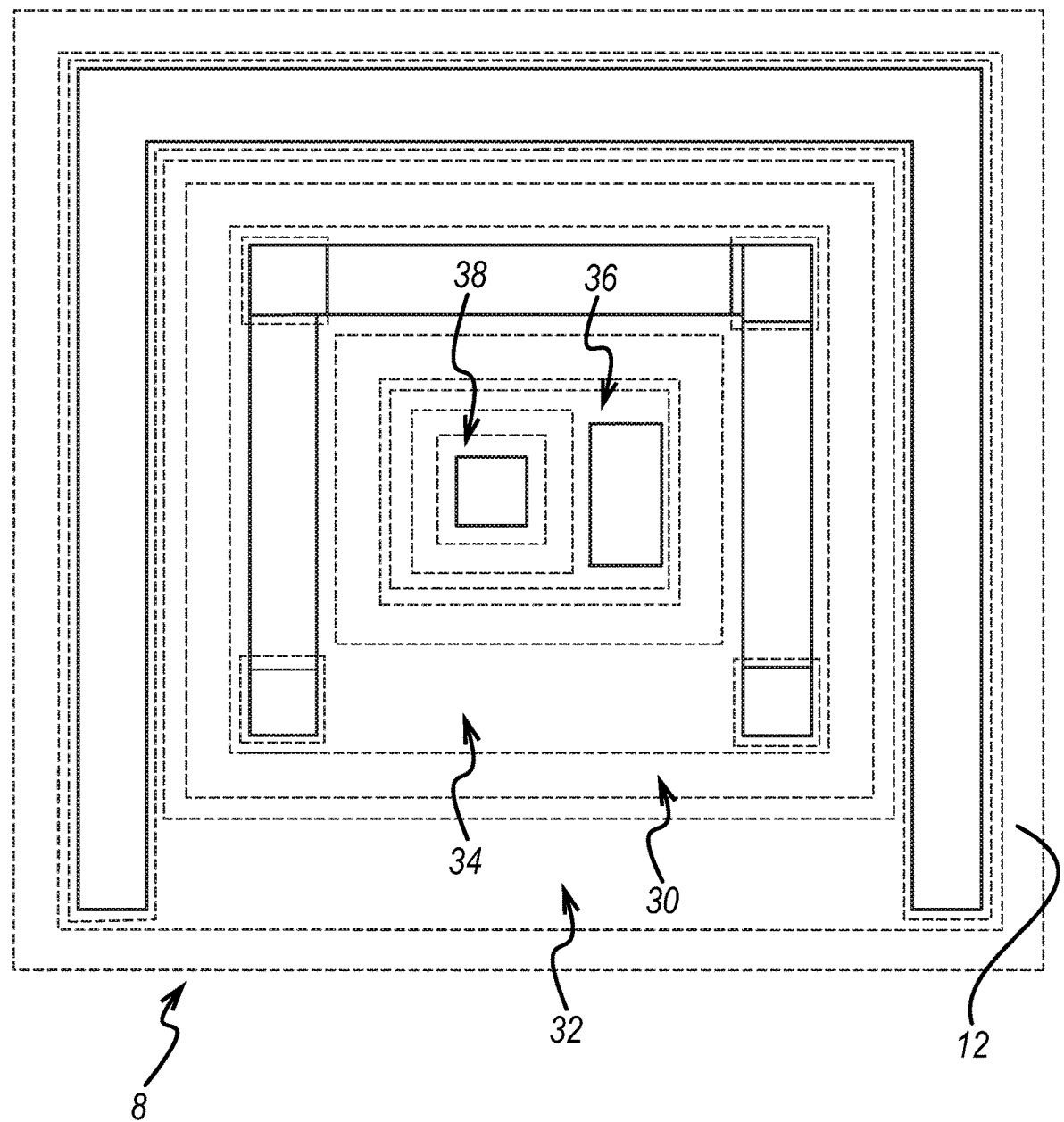
FIG. 2a is a plan view of a pnp lateral bipolar junction transistor according to the present invention.
Figure 2B:
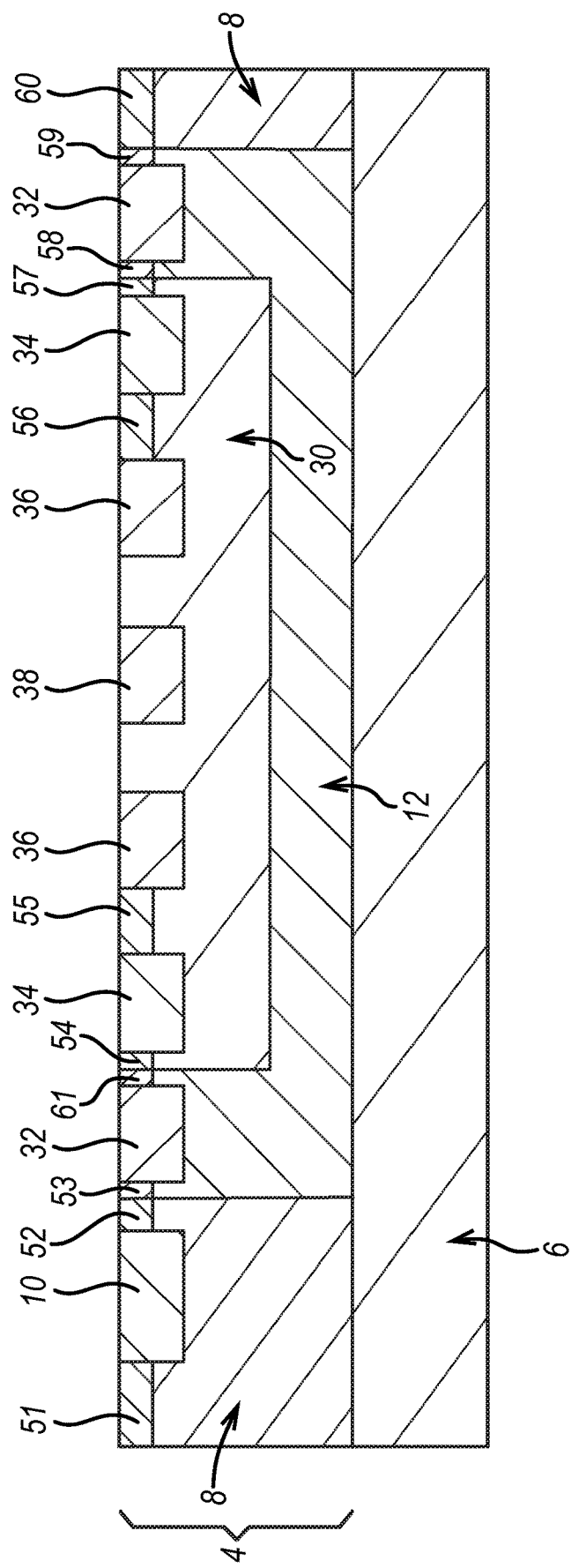

FIGS. 2a and 2b depict a further lateral bipolar junction transistor in accordance with the present invention. This lateral bipolar junction transistor is a pnp lateral bipolar junction transistor. All equivalent features that were depicted in FIGS. 1a and 1b have the same reference numerals.

Again, the device is formed within an epitaxial layer 4 that is on a substrate 6, both of these being silicon carbide. The epitaxial layer 4 has a boundary region 8. The substrate 6 and boundary region 8 are all n-type conductivity regions so as to form an isolated p-type conductivity region 12. This region has a highly p-doped area 32 that has aluminium as a p-type dopant at a level of $1\times10^{20}$ cm$^{-3}$ that facilitates connection to the p-type region 12. Within the p-type conductivity region 12 is an n-type conductivity well region 30 that has nitrogen as an n-type dopant at a level $4\times10^{17}$ cm$^{-3}$ so as to have n-type conductivity. The lateral bipolar junction transistor regions are formed in well region 30.

The well region 30 with n-type conductivity forms the base of the transistor. There is base contact region 34 that is a highly doped n-type conductivity region with phosphorus as an n-type dopant at a level of $5\times10^{19}$ cm$^{-3}$.

Highly doped p-type conductivity regions for the collector region 36 and the emitter region 38 are formed in the base region 30. The collector region 36 and emitter region 38 have aluminium present as a p-type dopant at a level of $1 \times 10^{20}$ cm$^{-3}$ so as to have a p-type conductivity. The collector region 36 and emitter region 38 are separated by the base region 30. In particular, the collector region 36, base region 30, and emitter region 38 are arranged along the upper surface of the silicon carbide layer 4. In this way the pnp lateral bipolar junction transistor is formed.

The active area of the transistor is the area containing the collector region 36, emitter region 38 and the base region that is between the collector region 36 and the emitter region 38. This active area of the base region is free of further doping. All other areas 51, 52, 53, 54, 55, 56, 57, 58, 59, 60, 61 arranged along the surface of the silicon carbide layer contain additional doping in order to minimise the presence of parasitic lateral bipolar junction or MOS transistors.

The upper surface along which the collector, base and emitter regions are arranged is passivated with a silicon dioxide layer (not shown).

In relation to FIG. 2a, the emitter 38 has a square area with a side length of 5 µm, and the gap between the collector region 36 and emitter region 38 is 1.2 µm. Although this embodiment depicts a single emitter having a square plan area, it is possible to utilise an arrangement of multiple emitters with the present invention. These emitters can be connected in parallel. It is also possible for the emitter to have a different plan area shape, such as hexagonal, rectangular, circular, a shape with a plurality of fingers etc.

A process for producing an npn lateral bipolar junction transistor of the present invention will now be described with reference to FIGS. 1a and 1b.

For the substrate a heavily n-doped 4H silicon carbide Si-face substrate (wafer) 6 is used. On top of this substrate, a lightly doped p-type epitaxial layer 4 is formed.

A silicon dioxide dielectric material that is thick enough to block the subsequent ion implantation is deposited on top of the epitaxial layer 4. A pattern is defined in the dielectric such that areas to be retained as p-type epitaxial regions remain blocked by overlying dielectric, and areas to be lightly doped with n-type dopant have the dielectric removed.

A series of nitrogen implants, up to an energy of 2 MeV, are performed so that implanted lightly doped n-type region 8 that extends the full depth of the epitaxial layer 4 is formed. This n-type region 8, along with the substrate 6 define the p-type region 12. A low energy threshold adjust implant of either aluminium or nitrogen may also be performed at this stage. The dielectric layer is then removed.

Next, a further dielectric material layer that is thick enough to block the subsequent ion implantation is deposited on top of the wafer. A pattern is defined in the dielectric such that windows are opened where heavily doped n-type regions are required for the npn bipolar transistors collector region 16 and emitter region 18, and the substrate contact region 10. A series of shallow phosphorous implants are performed to create the required heavily doped n-type doping profile. The dielectric layer is then removed.

Dielectric material thick enough to block the subsequent ion implantation is again deposited on top of the wafer. A pattern is defined in the dielectric such that windows are opened where heavily doped p-type implanted regions are required for the base region body contact 14. A series of shallow aluminium implants are performed to create the required heavily doped p-type doping profile. The dielectric layer is then removed.

Dielectric material thick enough to block the subsequent ion implantation is deposited on top of the wafer. A pattern is defined in the dielectric such that windows are opened above the p-type region in areas where transistors will not be formed (to be referred to as field areas).

A series of shallow aluminium implants are performed to increase the p-type doping in the p-type field areas 43, 44, 45, 46 such that lateral parasitic p-type region field transistors are turned off. The dielectric layers are then removed.

A thin dielectric layer (such as silicon dioxide) is deposited to protect the SiC surface. A pattern is defined with photoresist (thick enough to block the subsequent ion implant) such that windows are opened above the n-type doped regions in field areas.

A series of shallow nitrogen implants are performed to increase the n-type doping in these n-type field areas 41, 42, 47, 48 such that lateral parasitic n-type field transistors are turned off. The photoresist material is then removed.

A pattern is defined with photoresist (thick enough to block the subsequent ion implantation) such that windows are opened above the p-type regions, in areas where transistors will be formed (to be referred to as active areas). A shallow nitrogen implant is performed to reduce the p-type doping in the p-well active areas such that the transistor gain is adjusted. The photoresist material is then removed. The thin dielectric layer is then removed.

All implants are annealed using a carbon cap to protect the SiC surface. The carbon cap material is then removed.

A field dielectric (such as silicon dioxide) is formed on the SiC surface. A pattern is defined with photoresist such that windows are opened in the dielectric where transistor active areas are required. The exposed dielectric is removed by etching from the active areas. The photoresist is removed.

A silicon dioxide gate dielectric (not shown) is then formed on the silicon carbide surface.

Contacts can then be formed as follows. Thick SiO$_2$ is deposited. A pattern is defined with photoresist such that windows are opened where contacts are required to be made to underlying heavily doped p-type SiC and heavily doped n-type SiC regions within active areas. The exposed SiO$_2$ is removed by etching from the contact areas. The photoresist is removed.

Metal for forming ohmic contacts to the heavily doped n-type SiC is deposited. A pattern is defined with photoresist such that photoresist only remains above areas where the n-type SiC ohmic contact metal is required. The exposed n-type SiC ohmic contact metal is removed by etching. The photoresist is removed. The patterned ohmic contact metal is annealed to form ohmic contacts to the n-type SiC.

Metal for forming ohmic contacts to the heavily doped p-type SIC is then deposited. A pattern is defined with photoresist such that photoresist only remains above areas where p-type ohmic contact metal is required. The exposed p-type ohmic contact metal is removed by etching. The photoresist is removed. The patterned ohmic contact metal is annealed to form ohmic contacts to the p-type SiC.

Interconnect metal can then be deposited if desired. A pattern is defined with photoresist such that photoresist only remains above areas where interconnect metal is required. The exposed interconnect metal is removed by etching, leaving interconnect metal tracks. The photoresist is removed. The interconnect metal used with the present invention may be a refractory interconnect metal.

Thick SiO$_2$ is deposited. A pattern is defined with photoresist such that windows are opened where external connections are required to interconnect metal pads. The exposed SiO$_2$ is removed by etching from the pad areas. The photoresist is removed The process for producing the pnp lateral bipolar junction transistor of the present invention as depicted in FIGS. 2a and 2b is substantially analogous to the process described in relation to the npn lateral bipolar junction transistor of FIGS. 1a and 1b. However, the pnp device depicted is formed in a well 30. Well 30 is formed by conducting a series of nitrogen implants so that well 30 is doped n-type in the p-type epitaxial layer 4. The implant energies are such that the dopant is distributed from roughly the middle to the top of the epitaxial layer 4.

Figure 3:
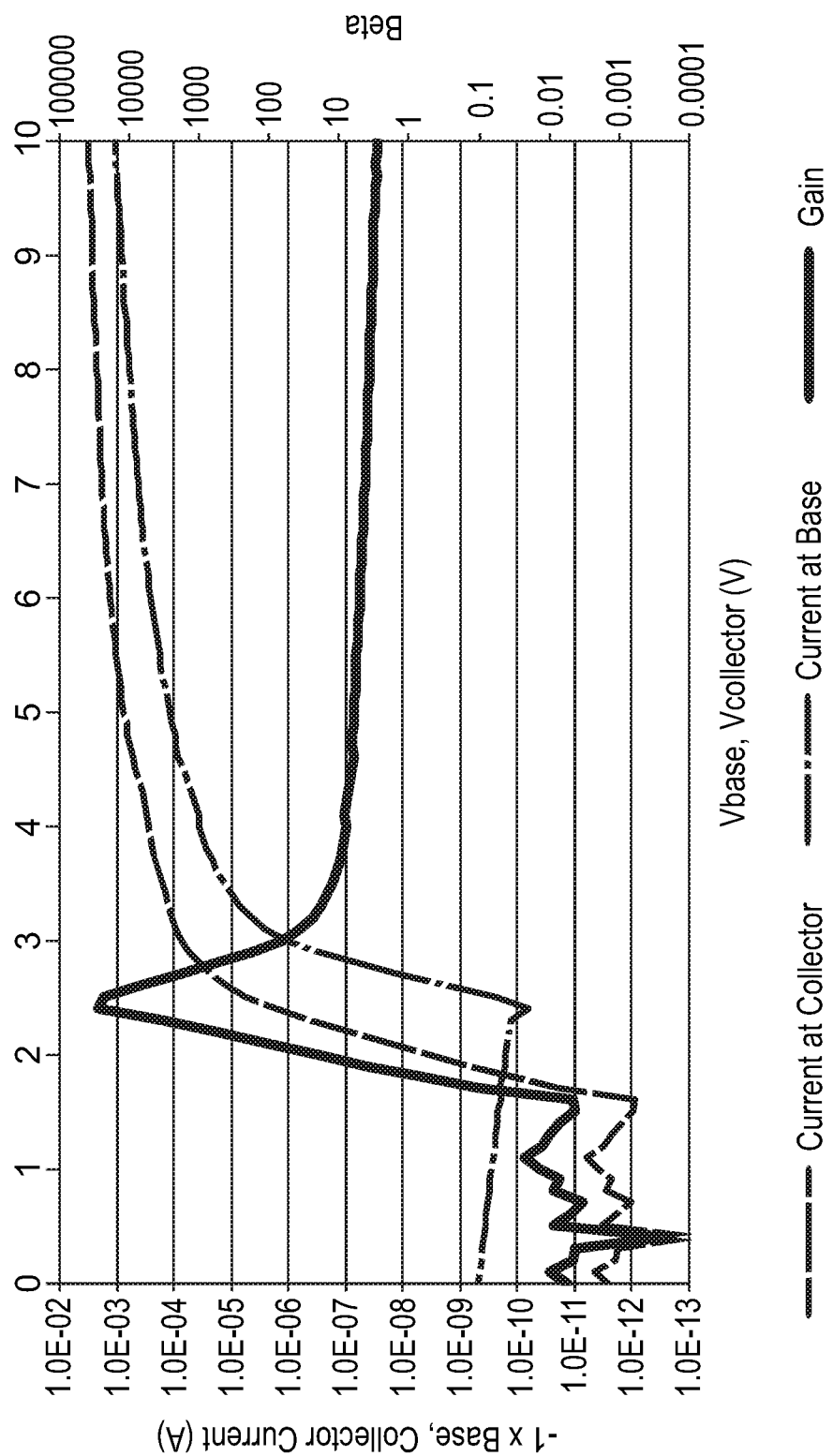

A Gummel plot for the lateral bipolar junction transistors depicted in FIG. 1a was acquired with the substrate biased at +15 volts relative to the emitter to ensure the base/substrate diode was reverse biased and did not influence the measurements. The resulting plot is illustrated in FIG. 3. A remarkably high gain of over 10,000 is exhibited by this device. As noted herein, such a high gain is surprising for a lateral bipolar junction transistor and especially one fabricated in silicon carbide.

Figure 4:
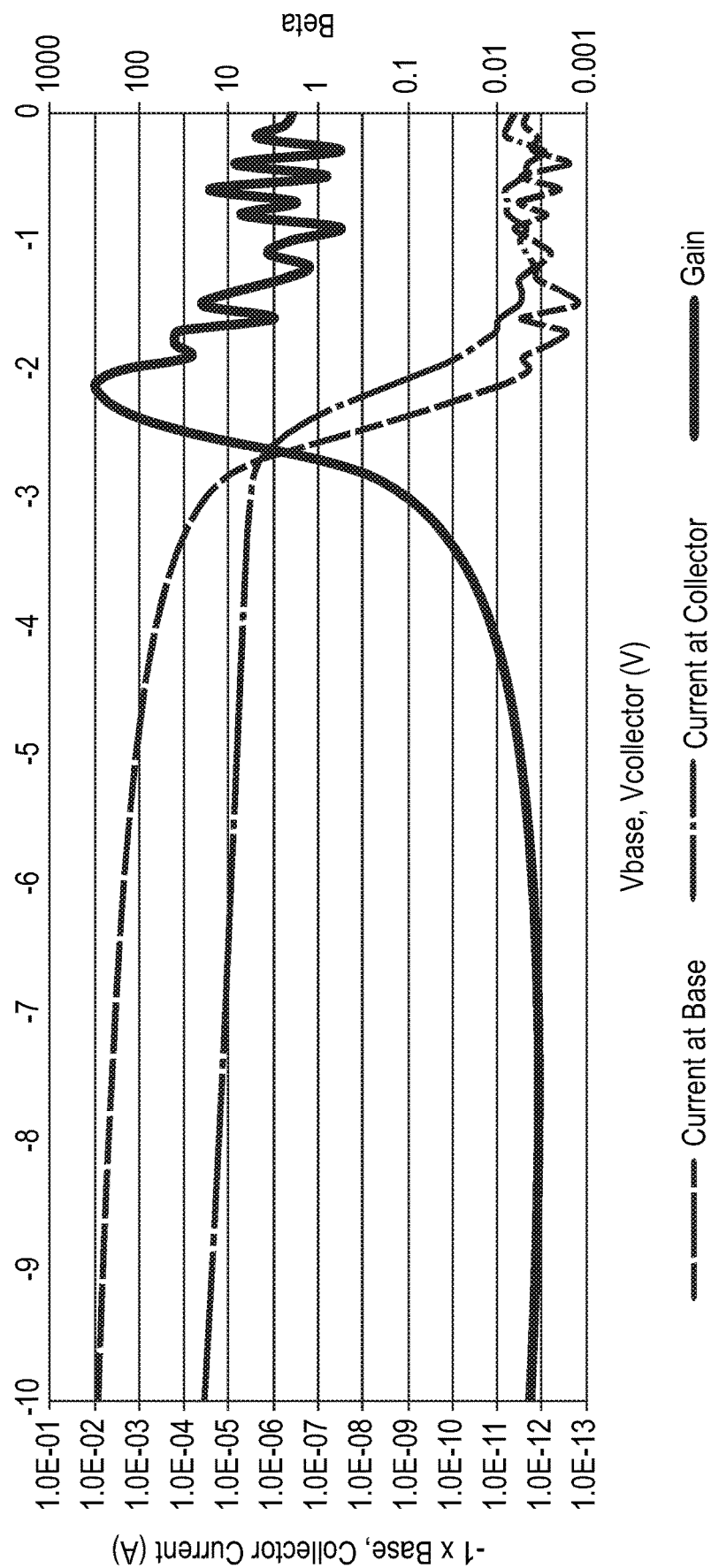

A Gummel plot for the lateral bipolar junction transistor depicted in FIG. 2a was acquired. The p-well region 12 was biased at −15 volts relative to the emitter to ensure the base/p-region diode was reverse biased and did not influence the measurements. The substrate was allowed to float. The resulting plot is given in FIG. 4. This pnp lateral bipolar junction transistor has a surprisingly high gain of around 300.

Overall, silicon carbide lateral bipolar junction transistors as described herein have surprisingly high gain making them advantageous for numerous applications.

The present invention has been described with reference to specific embodiments. However, the invention is defined by the scope of the following claims.

The invention claimed is:

1. A lateral bipolar junction transistor comprising:
a silicon carbide layer;
wherein the silicon carbide layer comprises
a base region comprising a first dopant of a first type so as to have a first conductivity type;
a collector region comprising a second dopant of a second type so as to have a second conductivity type, wherein the collector region is within the base region; and
an emitter region comprising a third dopant of the second type so as to have the second conductivity type, wherein the emitter region is within the base region; and wherein the base region, collector region and emitter region are all arranged along an upper surface of the silicon carbide layer;
a silicon carbide substrate, wherein the silicon carbide substrate comprises a fourth dopant of the second type so as to have the second conductivity type; wherein the silicon carbide layer is a silicon carbide epitaxial layer on the substrate, wherein the epitaxial layer comprises the first dopant of the first type so as to have a first conductivity type; and wherein the base region is within the epitaxial layer; and
a first boundary region, wherein the first boundary region comprises a fifth dopant of the second type so as to have the second conductivity type, and the first boundary region extends the depth of the epitaxial layer to the substrate.

2. The lateral bipolar junction transistor of claim 1, further comprising a dielectric layer on the upper surface of the silicon carbide layer overlapping the base region between the collector region and the emitter region.

3. The lateral bipolar junction transistor of claim 2, wherein the dielectric layer further overlaps the junction between the base region and the collector region, and the junction between the base region and the emitter region.

4. The lateral bipolar junction transistor of claim 2, wherein the dielectric layer is silicon dioxide.

5. The lateral bipolar junction transistor of claim 1, wherein the second dopant of the second type and the third dopant of the second type are the same dopant.

6. The lateral bipolar junction transistor of claim 5, wherein the concentration of the second dopant of the second type in the collector region is equivalent to the concentration of the third dopant of the second type in the emitter region.

7. The lateral bipolar junction transistor of claim 1, wherein the collector region has a concentration of the second dopant of the second type in the range of $1 \times 10^{19}$ cm$^{-3}$ to $1 \times 10^{21}$ cm$^{-3}$ and the emitter region has a concentration of the third dopant of the second type in the range of $1 \times 10^{19}$ cm$^{-3}$ to $1 \times 10^{21}$ cm$^{-3}$.

8. The lateral bipolar junction transistor of claim 1, wherein the base region has a concentration of the first dopant of the first type of less than $1 \times 10^{18}$ cm$^{-3}$.

9. The lateral bipolar junction transistor of claim 8, wherein the base region has a concentration of the first dopant of the first type of less than $1 \times 10^{17}$ cm$^{-3}$ at the upper surface of the silicon carbide layer between the collector region and the emitter region.

10. The lateral bipolar junction transistor of claim 1, wherein the first conductivity type is p-type conductivity and the second conductivity type is n-type conductivity.

11. The lateral bipolar junction transistor of claim 1, wherein the first conductivity type is n-type conductivity and the second conductivity type is p-type conductivity.

12. The lateral bipolar junction transistor of claim 1, wherein the base region is defined by the first boundary region and the substrate.

13. The lateral bipolar junction transistor of claim 1, further comprising
a second boundary region, wherein the second boundary region comprises a sixth dopant of the second type so as to have the second conductivity type, and the second boundary region extends the depth of the epitaxial layer to the substrate; and
wherein the base region is defined by the first boundary region, the second boundary region and the substrate.

14. The lateral bipolar junction transistor of claim 13, wherein the fifth dopant of the second type and the sixth dopant of the second type are the same dopant of the second type.

15. The lateral bipolar junction transistor of claim 13, further comprising
a well region comprising a seventh dopant of the second type so as to have a second conductivity type, wherein the well region extends from the upper surface of the silicon carbide layer into the silicon carbide layer but does not extend the full depth of the silicon carbide layer;
a collector/source region comprising an eighth dopant of the first type so as to have the first conductivity type, wherein the collector/source region is within the well region;
an emitter/drain region comprising a ninth dopant of the first type so as to have a first conductivity type, wherein the emitter/drain region is within the well region; and wherein the well region, collector/source region and emitter/drain region are all arranged along the upper surface of the silicon carbide layer.

16. The complementary device of claim 15, wherein the eighth dopant of the first type and the ninth dopant of the first type are the same dopant of the first type.

17. The lateral bipolar junction transistor of claim 1, further comprising an interconnect layer that provides connections to the base region, the collector region and the emitter region.

* * * * *